SOLID STATE EPITAXIAL GROWTH OF SILICON BY MIGRATION FROM A SILICON-ALUMINUM ALLOY DEPOSIT
Filed Oct. 21, 1965
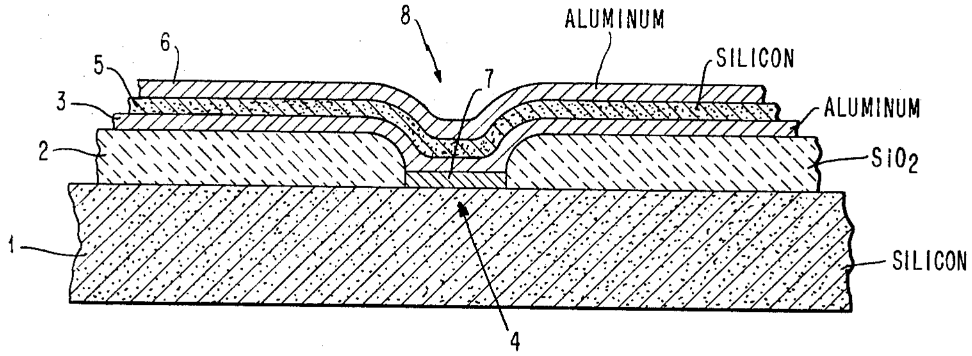
INVENTOR.
LUBERTUS L. KUIPER
BY J W Armbruster
ATTORNEY 3,413,157
Patented Nov. 26, 1968

3,413,157

SOLID STATE EPITAXIAL GROWTH OF SILICON BY MIGRATION FROM A SILICON-ALUMINUM ALLOY DEPOSIT

Lubertus L. Kuiper, Fishkill, N.Y., assignor to International Business Machines Corporation, Armonk, N.Y., a corporation of New York Filed Oct. 21, 1965, Ser. No. 499,189
7 Claims. (Cl. 148—1.5)

This invention relates generally to the method and means for producing semiconductor devices having low forward resistivity and more particularly to the growth of a silicon film at low temperature between a silicon substrate and an aluminum silicon alloy conductor thereon.

When the silicon in a silicon doped aluminum layer is above the maximum solid solubility of silicon in aluminum, then it has been noticed that when the silicon doped aluminum is heated below the silicon aluminum eutetic temperature, silicon crystals are grown in and on the aluminum, the size and number of the crystals being dependent upon the heating time. When a thin layer of silicon doped aluminum is alloyed during evaporation with silicon upon a silicon device, or a plurality of separate layers of aluminum and silicon are evaporated upon such a device, subsequent heat treatments below the silicon aluminum eutectic temperature will cause silicon to be grown on the original silicon substrate surface. The doping of the silicon being given by the solid solubility of the aluminum plus its impurities at this heat treatment temperature. By following such procedures, diodes with a low breakdown voltage of twenty volts have been made.

Heretofore growth of silicon was done at high temperature (epitaxial silicon) yielded during epitaxial growth diffusion, or from molten alloys, producing a penetration into the silicon which was difficult to control and not uniform.

The present invention offers the method of making planar devices having very low resistivities as, for example, an epitaxial layer can be provided as thin and as lowly doped as possible, through holes in the silicon dioxide layer of the oxidized epitaxial wafer. Silicon can be grown out on the evaporated silicon doped aluminum layer at a low temperature and consequently no out diffusion at the epitaxial layer can take place. Therefor there is presented at a land area a very thin epitaxial layer yielding a very low diode resistance and consequently for a set limit of the forward voltage drops, the diode can be made smaller and yield better speed.

An object of the invention is to provide a method for producing a more uniform silicon film on a semiconductor device.

Another object of the invention is to provide an improved method for fabricating a diode.

Another object of the invention is to provide an improved method for producing a film of silicon between a silicon device and an aluminum alloy conductor thereon.

Another object of the invention is the production of a uniformly aluminum doped silicon layer grown on a semiconductor wafer.

A still further object of the invention is the provision of a method of growing a silicon film on a semiconductor device of the kind having a plurality of layers of aluminum and silicon thereon, said device being heated to a low temperature, below the eutetic temperature of the aluminum silicon alloy, to grow a layer of silicon between the device and the alloy thereon.

Another object of the invention is the provision of very small high speed diodes wherein there are very thin epitaxial layers characterized by very low diode resistance.

Another object of the invention is the provision of a silicon device having a silicon layer with aluminum uniformly distributed throughout such a grown layer without a varying density gradient impurity concentration decreasing with distance from the surface.

A still further object of the invention is the provision of a silicon device having a silicon film thereon of a thickness of about 20,000 A. wherein there is a uniform distribution of about 1.59% aluminum throughout said film.

Accordingly it is an object of this invention to provide a semiconductor device whose contact structure provides improved operating characteristics.

A further object of the invention is to provide a semiconductor device of the type described wherein the contact structures are extremely small but easily fabricated with uniform characteristics and subject to operation at extremely high speeds.

Yet another object of the invention is to provide a semiconductor device having the superior characteristics noted above and fabricated by the process of the present invention.

For future reference to techniques for forming oxide layers and other layers the processes taught in copending applications assigned to the same assignee as this application are of interest and they are Ser. No. 141,669 filed Sept. 29, 1961, now U.S. Patent Ser. No. 3,247,428, and Ser. No. 291,322, filed on June 28, 1963.

The foregoing and other objects, features and advantages of the invention will be apparent from the following more particular description of a preferred embodiment of the invention as illustrated in the accompanying drawing showing a sectional view of the semiconductor device and the various films and layers of aluminum and silicon thereon.

In the drawing:

The single sheet of drawing shows a cross-section of a silicon device. Briefly, the present method of growing a silicon film or layer on a silicon device comprises the formation of a silicon dioxide layer on such a device wherein holes in the silicon dioxide provide access to the silicon surface. Over such silicon dioxide and also over the holes therein, one or more layers of aluminum silicon alloy or separate layers thereof are deposited and later heated at a relatively low temperature of about 560° C. to cause the silicon to migrate through the alloy to the line of contact between the alloy conductor and the surface of the device.

Observations have detected that when the silicon doped aluminum is heated below the silicon aluminum eutectic temperature, silicon crystals are grown in and on the aluminum, the size and number of such crystals being dependent upon the heating time and degree of temperature. When a thin layer of aluminum is alloyed during evaporation with silicon, and at a lower temperature than the temperature with which the aluminum and silicon is evaporated, subsequent heat treatments below the silicon aluminum eutectic temperature cause the silicon to be grown on the original silicon substrate surface, the doping of the silicon being given according to the solid solubility on the aluminum plus its impurities at this heat treatment temperature. In such a fashion, diodes with a breakdown voltage of 20 volts have been fabricated.

Up until now, any growth of silicon was performed at high temperature (epitaxial silicon) prevalent during such epitaxial growth diffusion, or from molten alloys yielding a firmer penetration into the silicon which is difficult to control and difficult to make uniform rather than gradient.

By the present invention of low temperature reheating there is given the possibility of making planar devices having very low resistivities, for example, an epitaxial layer can be fabricated as thin and as lowly doped as possible through the holes in the silicon dioxide layer of the oixdized epitaxial wafer since silicon can be grown out on evaporated silicon doped aluminum layer at a low temperature, there is consequently no out diffusion taking place at the epitaxial layer therefore we can start with a very thin epitaxial layer giving very low diode resistances and consequently for a set limit of the forward voltage drops the diode can be made smaller and given much higher speed.

Referring generaly to the drawing, it may be assumed that the semiconductor device is fabricated from a wafer 1 of a semiconductor material for example, a n-type silicon, a plurality of surface junction regions may be formed on discrete areas of the surface of wafer 1 by a suitable technique and thus a number of possible junctions are formed at the regions 4.

After the wafer areas are prepared, a silicon dioxide layer 2 is grown upon the entire upper surface of wafer 1. For purposes of illustration layer 2 may be about 9,000 A. in thickness, and although other conventional methods may be employed, the preferred oxide technique comprises placing the wafer 1 in an oxidizing atmosphere at an elevated temperature and adding $H_2O$ vapors to the oxidizing atmosphere so as to expedite the growth of layer 2. Layer 2 aids in retaining the surface of wafer 1 free from ambient impurities and it provides an insulation layer over which conductive material may rest other than at depressed land contact areas, one such area 4 being to the center of the opening in the oxidized layer 2.

The land hole areas 8 in layer 2 are prepared for etching by first placing a pattern of photoresist material over it. A photoresist material is one which upon exposure to light becomes resistant to action of certain chemicals and selected areas. The photoresist is applied in a conventional maner on all upper surfaces. When dry, a mask comprising transparent material with opaque areas thereon is placed over the wafer 1. Light is passed through the transparent areas of the mask and exposes the photoresist thereunder so that when a developer is applied the non-exposed area is washed away leaving precisely dimensional holes at 8 in the resist above layer 2.

Then an etchant is used to attack the $SiO_2$ layer 2 and land areas 8 without affecting the surface region 4 of the silicon wafer 1 thereunder. The exposed area of layer 2 is removed by submerging the device in an etchant such as aluminum bifluoride buffered in a solution of hydrofluoric acid. During the etching step the remaining resist pattern serves to mask the surface of the silicon dioxide layer 2 so as to insure the removal of only the predetermined hole areas 8 of the layer 2. The result is that the hole 8 is extended through to the top surface of the wafer 1. Once the remaining resist is dissolved by a solvent and the surface region 8 is exposed through layer 2, steps are taken to deposit a pattern of resist to define areas other than desired contact areas, conductor lead lines and terminals connected thereto. After these steps, a contact metal or alloy is deposited on the device in a manner about to be explained.

The usual metal deposition process consists of coating the entire upper surface of the device as well as the resist thereon with the contact metal and then selectively removing the portions of the metal over the resist pattern along with the pattern. After the metal coating step, the resist is attacked by a solvent which softens and loosens it so that the contact metal thereon may be peeled away. A selected deposit of the contact metal or alloy is left as definitions of conductors and also on the exposed hole regions. When there is no underlying pattern of resist, an alternate procedure is used to photoetch the conductor metal by a pattern of resist placed thereover and chemically treated to produce the desired conductors and land pattern.

In the present case of layer 3 of aluminum is first evaporated over the surface of wafer 1 and is brought into contact with the area 4 in the surface of wafer 1. The layer 3 is approximately 500 A. in thickness. A layer 5 of silicon approximately 3,000 A. in thickness is then evaporated over the lower aluminum layer 3. Thereafter an aluminum layer 6 of approximately 4,000 A. in thickness is evaporated over the silicon layer 5. Subsequent to these evaporations the wafer 1 with the evaporated layers thereon is heated to approximately 565° C., this temperature being slightly below the aluminum-silicon eutectic temperature of 577° C. At this lower temperature, silicon has a high mobility in aluminum and therefore silicon from the evaporated silicon layer 5 will migrate through the evaporated aluminum layer 3 and grow on the surface area 4 of the silicon wafer 1 as an epitaxial layer 7. The aluminum layer 3 serving as a carrier for the silicon atoms.

The solid state grown silicon layer 7 will be doped to the maximum solubility of the aluminum and silicon because of the dissolving of the aluminum into the silicon. The thickness of the aluminum doped type silicon layer 7 grown on the wafer 1 will be approximately 20,000 A. in thickness.

If the layer 7 were formed by diffusion it would have a density gradient of impurity concentration with a maximum concentration at the surface decreasing with distance from the surface. However, utilizing the method of the present invention there is no impurity gradient, the aluminum being uniform throughout the grown layer 7. It may be noted, however, that only maximum impurity concentrations are to be produced by the subject method. During growth of layer 7, no impurity will be diffused out of wafer 1 because of the low growing temperature. Therefore, there will not be an area of lower impurity concentration immediately below the layer 7 to increase the forward resistance of the device thus the forward resistance of the wafer will be very low as it is a function of the epitaxial layer 7 alone.

The timing of the low temperature growth of the silicon is arranged to last about ½ hour at the range of 560° C. in order to deposit the layer of 20,000 A. to 50,000 A. of the silicon film 7.

A passivation of the entire device may be carried out at a low temperature.

While the invention has been particularly shown and described with reference to preferred embodiments it will be understood by those skilled in the art that various changes in form and detail may be made therein without departing from the spirit and scope of the invention.

What is claimed is:

1. A method of growing a thin, epitaxial silicon layer upon a silicon substrate, said method comprising:
depositing an alloy of silicon and aluminum upon said substrate, and
maintaining said alloy and said substrate at a temperature below the eutectic temperature of the alloy to cause the growth of an epitaxial layer at the interface between the alloy and said substrate.

2. The method of fabricating a rectifying contact to a given conductivity type monocrystalline silicon semiconductor wafer comprising the steps of:
forming an oxide layer with openings on said wafer,
depositing an alloy of silicon and aluminum on said oxide layer and exposed wafer portions,
heating said device to a temperature below the eutectic point of the alloy to cause migration of said silicon to the surface of said wafer to form an epitaxial layer thereon.

3. The method of fabricating a semiconductor device comprising:
placing an alloy of silicon and aluminum on a substrate of a first conductivity, said alloy having a certain eutectic temperature, and
forming an epitaxical layer of opposite conductivity on said substrate by heating said alloy just below said eutectic temperature.

4. The method of forming a silicon layer on a silicon semiconductor wafer comprising:

depositing an alloy of aluminum silicon on said wafer and heating said wafer to a temperature of about 565° C. for about one-half hour to produce epitaxial growth of silicon of over 20,000 A. in thickness.

5. The method of growing an epitaxial silicon layer on a silicon wafer comprising the steps of:

depositing on said surface a succession of layers of first aluminum and then silicon of progressively greater thickness and heating said wafer to a temperature below the eutectic temperature for the alloy of aluminum and silicon to form said epitaxial layer.

6. The method of producing an epitaxial layer of single crystal silicon of one conductivity type upon a body of silicon of the opposite conductivity type comprising the steps of:

cleaning the surface of said body of silicon, depositing thereon a succession of layers of first aluminum and then silicon, and heating said body at a temperature of about 565° C. for a short period of time to form said epitaxial layer.

7. A semiconductor device of the type formed by the process of claim 2.

References Cited

UNITED STATES PATENTS 2,877,147 3/1959 Thurmond ---------- 148—1.5

OTHER REFERENCES

Constitution of Binary Alloys, Hansen, second edition, 1958, published by McGraw-Hill Book Company, pages 132–134 and 232.

L. DEWAYNE RUTLEDGE, *Primary Examiner.*

P. WEINSTEIN, *Assistant Examiner.*